US010866448B2

(12) United States Patent
Sun et al.

(10) Patent No.: US 10,866,448 B2
(45) Date of Patent: Dec. 15, 2020

(54) ARRAY SUBSTRATE, METHOD FOR MANUFACTURING THE SAME, DISPLAY PANEL AND DISPLAY DEVICE

(71) Applicants: Ordos Yuansheng Optoelectronics Co., Ltd., Ordos (CN); BOE Technology Group Co., Ltd., Beijing (CN)

(72) Inventors: Shicheng Sun, Beijing (CN); Zhiqiang Wang, Beijing (CN); Pei Wang, Beijing (CN); Peirong Huo, Beijing (CN); Shuang Hu, Beijing (CN)

(73) Assignees: Ordos Yuansheng Optoelectronics Co., Ltd., Ordos (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/332,185

(22) PCT Filed: Jun. 8, 2018

(86) PCT No.: PCT/CN2018/090373
§ 371 (c)(1),
(2) Date: Mar. 11, 2019

(87) PCT Pub. No.: WO2019/033837
PCT Pub. Date: Feb. 21, 2019

(65) Prior Publication Data
US 2019/0227362 A1    Jul. 25, 2019

(30) Foreign Application Priority Data

Aug. 15, 2017 (CN) .......................... 2017 1 0700498

(51) Int. Cl.
G02F 1/1333 (2006.01)
G06K 9/00 (2006.01)
(Continued)

(52) U.S. Cl.
CPC ........ *G02F 1/13338* (2013.01); *G02F 1/1333* (2013.01); *G02F 1/136286* (2013.01);
(Continued)

(58) Field of Classification Search
None
See application file for complete search history.

(56) References Cited

U.S. PATENT DOCUMENTS 5,920,640 A    7/1999  Salatino et al.
6,055,324 A *  4/2000  Fujieda ............... G06K 9/0002
                                                    382/124
(Continued)

FOREIGN PATENT DOCUMENTS

CN    104112120    10/2014
CN    105159506    12/2015
(Continued)

OTHER PUBLICATIONS

Office Action for corresponding CN application No. 201710700498.6 dated Apr. 26, 2019, with translation, 16 pages.
(Continued)

*Primary Examiner* — Ryan Crockett
(74) *Attorney, Agent, or Firm* — Myers Bigel, P.A.

(57) ABSTRACT

The embodiments of the present disclosure provide an array substrate, a method for manufacturing the same, a display panel, and a display device. The array substrate includes a plurality of data lines, a plurality of gate lines, and a fingerprint recognition region located on a basal substrate. The fingerprint recognition region includes a plurality of transmitting electrodes and a plurality of sensing electrodes intersected with the plurality of transmitting electrodes. Each transmitting electrode is electrically connected to one of the plurality of gate lines.

16 Claims, 8 Drawing Sheets

(51) Int. Cl.
*H01L 27/32* (2006.01)
*G02F 1/1362* (2006.01)

(52) U.S. Cl.
CPC ....... *G06K 9/0002* (2013.01); *G06K 9/00013* (2013.01); *H01L 27/323* (2013.01); *H01L 27/3272* (2013.01); *H01L 27/3276* (2013.01); *G02F 2001/136218* (2013.01); *H01L 27/3225* (2013.01); *H01L 2227/323* (2013.01)

(56) References Cited

U.S. PATENT DOCUMENTS

| | | |
|---|---|---|
| 2003/0016024 A1 | 1/2003 | Teranuma et al. |
| 2014/0218327 A1 | 8/2014 | Shi et al. |
| 2016/0260380 A1* | 9/2016 | Yang .......................... G09G 3/32 |
| 2017/0177111 A1* | 6/2017 | Qin .......................... G06F 3/044 |
| 2017/0185208 A1* | 6/2017 | Liu .......................... G06F 3/0446 |
| 2018/0088715 A1* | 3/2018 | Lee .......................... G06F 3/0416 |
| 2018/0101259 A1* | 4/2018 | No .......................... G06F 3/0416 |
| 2018/0188860 A1* | 7/2018 | Yang .......................... G06F 3/0416 |
| 2018/0285619 A1* | 10/2018 | Kim .......................... G09G 3/3266 |
| 2018/0349669 A1* | 12/2018 | Kim .......................... G06K 9/00013 |
| 2019/0012509 A1 | 1/2019 | Li et al. |
| 2019/0095000 A1* | 3/2019 | Huang .......................... G06F 3/044 |
| 2019/0227362 A1 | 7/2019 | Sun et al. |
| 2019/0325189 A1* | 10/2019 | Sun .......................... G06K 9/0002 |
| 2020/0043417 A1* | 2/2020 | Yang .......................... G09G 3/3291 |

FOREIGN PATENT DOCUMENTS

| | | |
|---|---|---|
| CN | 105956584 | 9/2016 |
| CN | 106024836 | * 10/2016 |
| CN | 106529463 | 3/2017 |
| CN | 106778508 | 5/2017 |
| CN | 107092901 | 8/2017 |
| CN | 107272244 | 10/2017 |

OTHER PUBLICATIONS

International Search Report and Written Opinion for PCT/CN2018/090373 dated Aug. 23, 2018 with translation, 14 pages.

* cited by examiner

ARRAY SUBSTRATE, METHOD FOR MANUFACTURING THE SAME, DISPLAY PANEL AND DISPLAY DEVICE

CROSS REFERENCE TO RELATED APPLICATIONS

The present application is a 35 U.S.C. 371 national stage application of PCT International Application No. PCT/CN2018/090373, filed on Jun. 8, 2018, which claims the benefit of Chinese Patent Application No. 201710700498.6, filed on Aug. 15, 2017, the contents of which are incorporated herein by reference in their entireties. The above-referenced International Application was published in the Chinese language as International publication No. WO 2019/033837 A1 on Feb. 21, 2019.

TECHNICAL FIELD

The present disclosure relates to the field of fingerprint recognition technology, and particularly to an array substrate, a method for manufacturing the same, a display panel, and a display device.

BACKGROUND

The fingerprint is the texture formed by the skin of the bulge (ridge) and the depression (valley) on the fingertip of the human finger. It is naturally formed in the evolutionary process of human beings. Because fingerprints have the characteristics of lifetime immutability, uniqueness and convenience, they have become synonymous with biometric identification, and are widely used in the field of identity information authentication and identification such as security and attendance.

Taking the application of fingerprint recognition in the field of display device (e.g., mobile phone or tablet computer) as an example, it can be used for, for example, identity authentication of a user. The integration of fingerprint recognition component and display device has attracted wide attention.

SUMMARY

An aspect of the present disclosure provides an array substrate. The array substrate includes: a plurality of data lines, a plurality of gate lines, and a fingerprint recognition region located on a basal substrate; the fingerprint recognition region includes: a plurality of transmitting electrodes and a plurality of sensing electrodes intersected with the plurality of transmitting electrodes; each transmitting electrode is electrically connected to one of the plurality of gate lines.

Optionally, an extending direction of the plurality of transmitting electrodes is same to an extending direction of the plurality of gate lines, and an extending direction of the plurality of sensing electrodes is perpendicular to the extending direction of the plurality of transmitting electrodes.

Optionally, a portion of the gate line located in the fingerprint recognition region constitutes the transmitting electrode; a width of a portion of the gate line located in the fingerprint recognition region is greater than a width of a portion of the gate line located outside the fingerprint recognition region.

Optionally, the transmitting electrode and the gate line are in different layers, and/or the sensing electrode and the data line are in different layers.

Optionally, the array substrate includes a first driving electrode connected to the data line, and a second driving electrode located opposite to the first driving electrode; the first driving electrode is located between the basal substrate and the second driving electrode; the transmitting electrode and the first driving electrode are located in a same layer, and a material of the transmitting electrode is same to a material of the first driving electrode; and/or the sensing electrode and the second driving electrode are located in a same layer, and a material of the sensing electrode is same to a material of the second driving electrode.

Optionally, the array substrate includes a first driving electrode connected to the data line, and a second driving electrode located opposite to the first driving electrode; the second driving electrode is located between the basal substrate and the first driving electrode; the transmitting electrode and the second driving electrode are located in a same layer, and a material of the transmitting electrode is same to a material of the second driving electrode; and/or the sensing electrode and the first driving electrode are located in a same layer, and a material of the sensing electrode is same to a material of the first driving electrode.

Optionally, each transmitting electrode is connected to a corresponding gate line through a plurality of via holes.

Optionally, the fingerprint recognition region is provided with an alignment mark; and/or the array substrate further includes a bonding region, and the bonding region is provided with an alignment mark.

Optionally, the plurality of sensing electrodes are located on a side of the plurality of transmitting electrodes facing away from the basal substrate.

Optionally, the array substrate further includes a shielding electrode located on a side of the transmitting electrode close to the basal substrate.

Optionally, the array substrate further includes a GOA circuit connected to the plurality of gate lines.

Another aspect of the present disclosure provides a display panel including the array substrate according to any one of the above-mentioned embodiments.

Another aspect of the present disclosure provides a display device including the above-mentioned display panel and a fingerprint recognition module connected to the plurality of sensing electrodes.

Optionally, the display panel further includes a source driving circuit, and the fingerprint recognition module is integrated in the source driving circuit.

Another aspect of the present disclosure provides a method for manufacturing an array substrate including a fingerprint recognition region; the method includes: providing a plurality of data lines and a plurality of gate lines on a basal substrate; forming a plurality of transmitting electrodes in the fingerprint recognition region, each transmitting electrode being electrically connected to a gate line; and forming a plurality of sensing electrodes intersected with the plurality of transmitting electrodes in the fingerprint recognition region.

Optionally, the plurality of gate lines include a set of gate lines spanning the fingerprint recognition region; the step of forming a plurality of transmitting electrodes in the fingerprint recognition region, each transmitting electrode being electrically connected to a gate line includes: for each gate line spanning the fingerprint recognition region, a width of a portion of the gate line located in the fingerprint recognition region is formed to be greater than a width of a portion of the gate line located outside the fingerprint recognition region.

Optionally, the plurality of gate lines include a set of gate lines spanning the fingerprint recognition region; the step of forming a plurality of transmitting electrodes in the fingerprint recognition region, each transmitting electrode being electrically connected to a gate line includes: forming a dielectric layer covering the plurality of gate lines; forming a via hole in the dielectric layer for each gate line spanning the fingerprint recognition region; an orthographic projection of the gate line on the basal substrate covering an orthographic projection of the via hole on the basal substrate; and forming a plurality of transmitting electrodes on the dielectric layer; each transmitting electrode being electrically connected to the gate line through the via hole.

BRIEF DESCRIPTION OF THE DRAWINGS

In order to more clearly illustrate the technical solutions in embodiments of the disclosure or in the prior art, the appended drawings needed to be used in the description of the embodiments or the prior art will be introduced briefly in the following. Obviously, the drawings in the following description are only some embodiments of the disclosure, and for those of ordinary skills in the art, other drawings may be obtained according to these drawings under the premise of not paying out creative work.

DETAILED DESCRIPTION OF THE DISCLOSURE

In the following, the technical solutions in embodiments of the disclosure will be described clearly and completely in connection with the drawings in the embodiments of the disclosure. Obviously, the described embodiments are only part of the embodiments of the disclosure, and not all of the embodiments. Based on the embodiments in the disclosure, all other embodiments obtained by those of ordinary skills in the art under the premise of not paying out creative work pertain to the protection scope of the disclosure.

The present disclosure provides an array substrate, a method for manufacturing the same, a display panel, and a display device. The integration degree of the display device including the fingerprint recognition component is improved by integrating the fingerprint recognition component into the array substrate.

Figure 1:
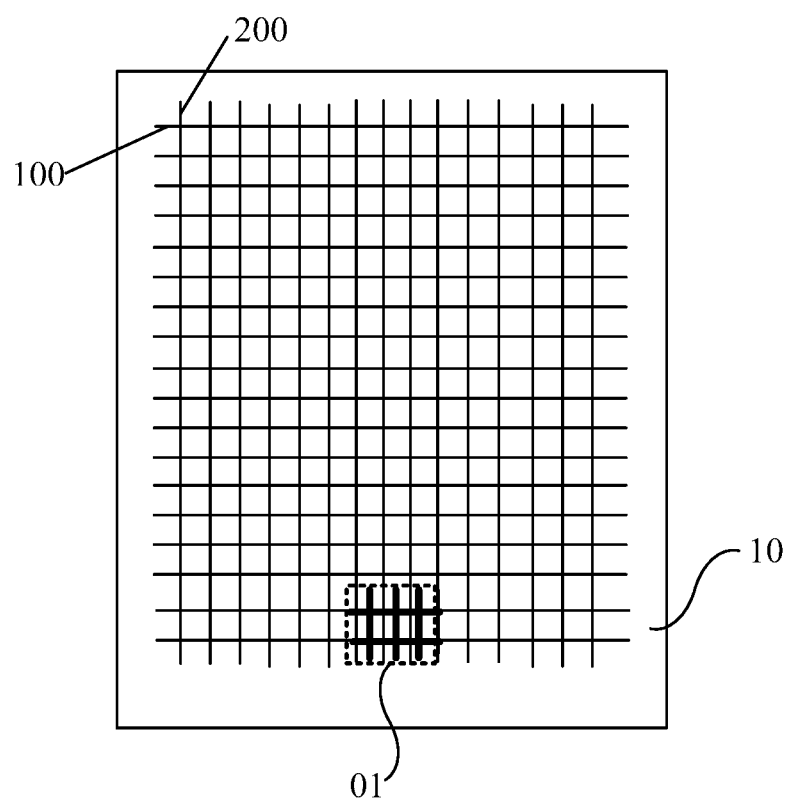
FIG. 1 is a structural schematic diagram of an array substrate including a fingerprint recognition region according to an embodiment of the present disclosure.
Figure 2:
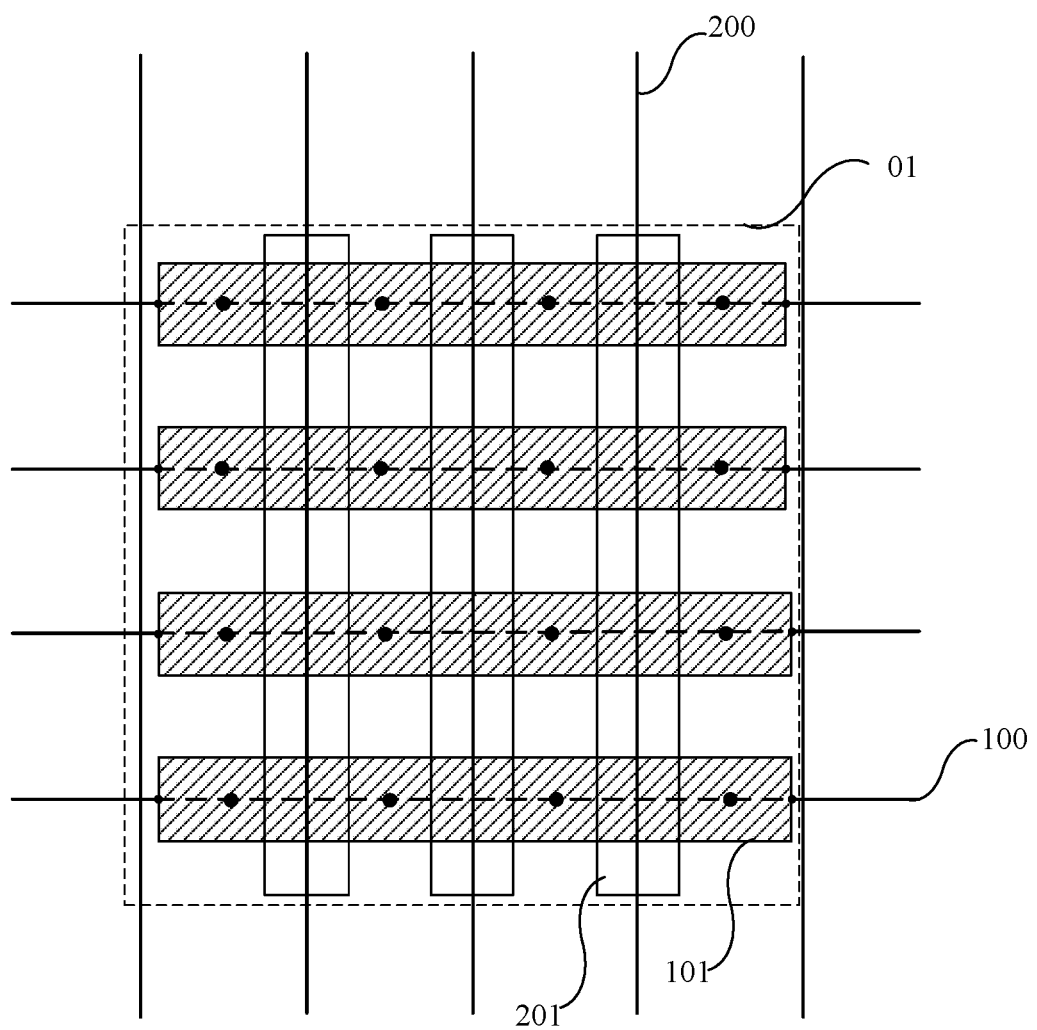
FIG. 2 is a structural schematic diagram of a fingerprint recognition region in an array substrate according to an embodiment of the present disclosure.

An embodiment of the present disclosure provides an array substrate. As shown in FIG. 1 and FIG. 2, the array substrate includes: a plurality of data lines 200, a plurality of gate lines 100, and a fingerprint recognition region 01 located on a basal substrate 10; the fingerprint recognition region 01 includes: a plurality of transmitting electrodes 101 and a plurality of sensing electrodes 201 intersected with the plurality of transmitting electrodes 101; each transmitting electrode 101 is electrically connected to one of the plurality of gate lines 100.

In the embodiment of the present disclosure, the transmitting electrodes and the sensing electrodes in the fingerprint recognition component are both disposed on the array substrate, and the transmitting electrodes are connected to the gate lines. When the array substrate is applied to a display device, the gate driving circuit in the display device can input not only a scanning signal to the gate line but also a transmitting signal to the transmitting electrode through the gate line. Therefore, the integration degree of the display device including the fingerprint recognition component is improved, the procurement of parts is reduced, and the assembly process is simplified.

It should be noted that the array substrate in the present disclosure may be an array substrate for an LCD (liquid crystal display), or an array substrate for an OLED (organic light emitting diode) display device, which is not limited herein.

In some embodiments, as shown in FIG. 2, an extending direction of the plurality of transmitting electrodes 101 is same to an extending direction of the plurality of gate lines 100, and an extending direction of the plurality of sensing electrodes 201 is perpendicular to the extending direction of the plurality of transmitting electrodes 101. The extending direction of the transmitting electrodes 101 in the present disclosure is not particularly limited. The extending direction of the transmitting electrodes 101 may also be inconsistent with the extending direction of the gate line 100. For example, an angle may be formed between the transmitting electrode 101 and the gate line 100. The transmitting electrode 101 may be linear or curved. In the present disclosure, each transmitting electrode is electrically connected to a gate line, thus the gate driving circuit in the display device can input not only a scanning signal to the gate line but also a transmitting signal to the transmitting electrode through the gate line. The specific shape of the transmitting electrode 101 is not limited herein. In order to simplify the manufacturing process and ensure an effective connection of the transmitting electrode to the gate line, optionally, the transmitting electrode 101 extends in the same direction as the gate line 100.

For the same reason, the extending direction of the sensing electrode 201 is not particularly limited as long as the sensing electrodes 201 and the transmitting electrodes 101 are disposed to intersect with each other to form a fingerprint sensing unit in an array form (i.e., a grid detection structure). In order to facilitate the manufacturing process, optionally, the extending direction of the sensing electrode 201 is perpendicular to the extending direction of the transmitting electrode 101. For convenience of explanation, in the following embodiments, the extending direction of the transmitting electrode 101 is the same as the extending direction of the gate line 100, and the extending direction of the sensing electrode 201 is perpendicular to the extending direction of the transmitting electrode 101.

Specifically, the specific settings of the transmitting electrodes 101 and the sensing electrodes 201 are further described below.

Figure 3A:
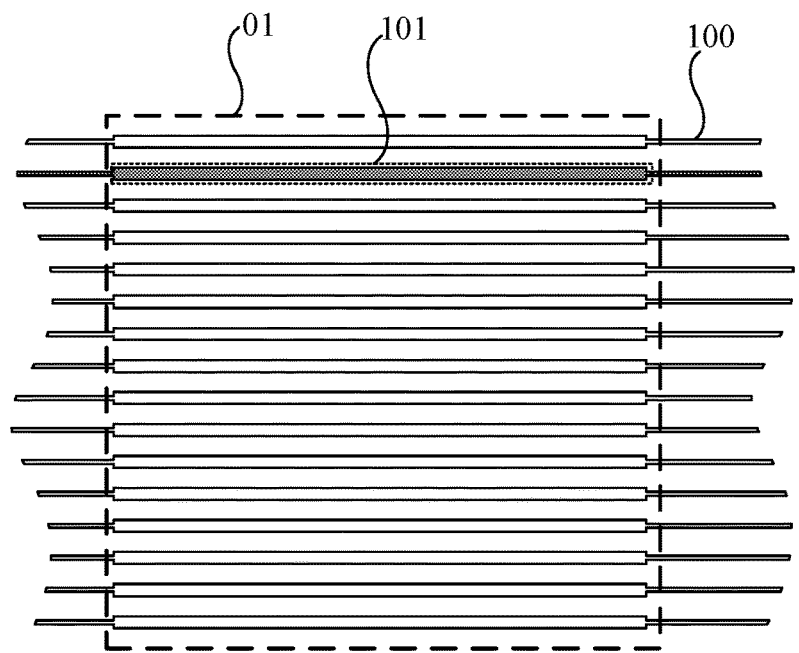
FIG. 3a is structural schematic diagram of a transmitting electrode of a fingerprint recognition region according to an embodiment of the present disclosure.

For example, as shown in FIG. 3a, the transmitting electrode 101 can be directly formed by a portion of the gate line 100 located in the fingerprint recognition region 01. That is, the transmitting electrode 101 and the gate line 100 are of a unitary structure, which can be produced by one manufacturing process. The width of the portion of the gate line 100 located in the fingerprint recognition region 01 is greater than the width of the portion of the gate line 100 located outside the fingerprint recognition region 01 to implement the fingerprint recognition function.

Figure 4:
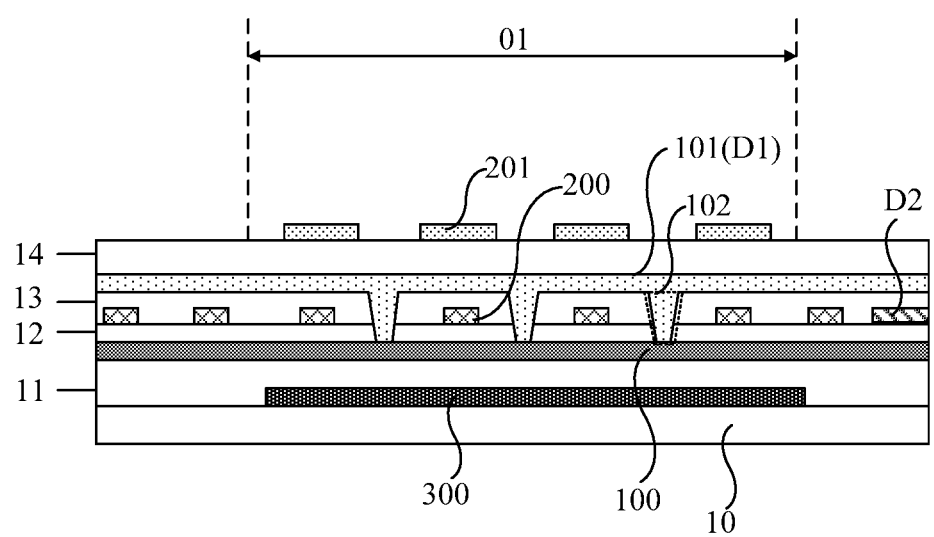
FIG. 4 is a schematic cross-sectional view of an array substrate including a fingerprint recognition region according to an embodiment of the present disclosure.

For another example, as shown in FIG. 2 and FIG. 4, the transmitting electrode 101 and the gate line 100 are located in different layers, that is, the transmitting electrode 101 and the gate line 100 are two independent portions (e.g. manufactured by two manufacturing processes respectively), which are electrically connected.

Figure 6:
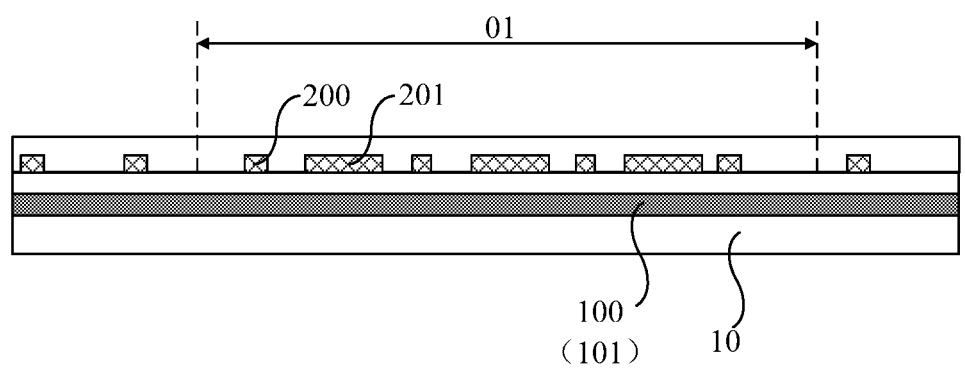
FIG. 6 is a schematic cross-sectional view of an array substrate including a fingerprint recognition region according to yet another embodiment of the present disclosure.

For example, as shown in FIG. 6, the sensing electrode 201 can be made of the same material and be located in the same layer as the data line 200, that is, the sensing electrode 201 and the data line 200 are fabricated by one manufacturing process, but the they are not electrically connected. In order to ensure the implementation of the fingerprint recognition function, the width of the sensing electrode 201 may be greater than the width of the data line 200.

Figure 3B:
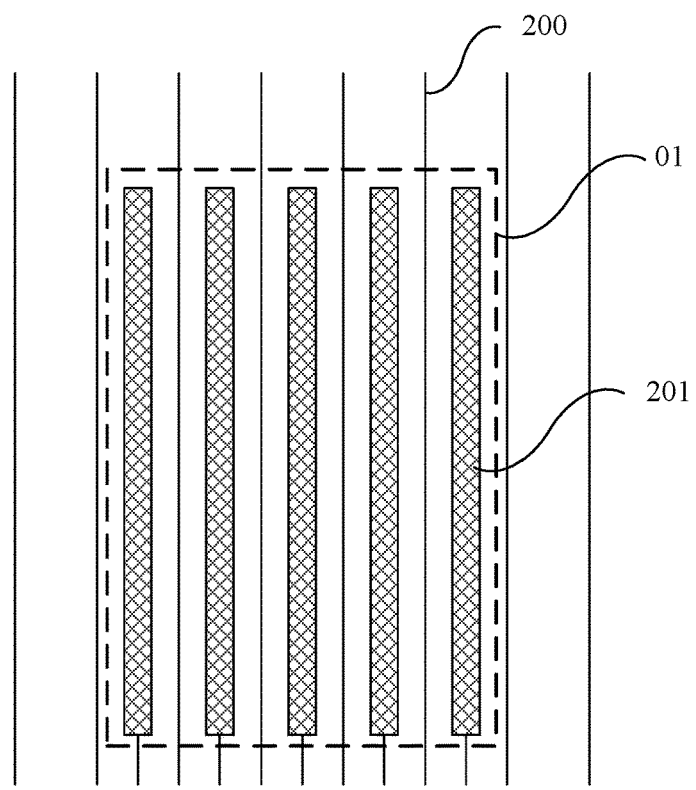
FIG. 3b is a structural schematic diagram of a fingerprint recognition region in an array substrate according to an embodiment of the present disclosure.
Figure 3C:
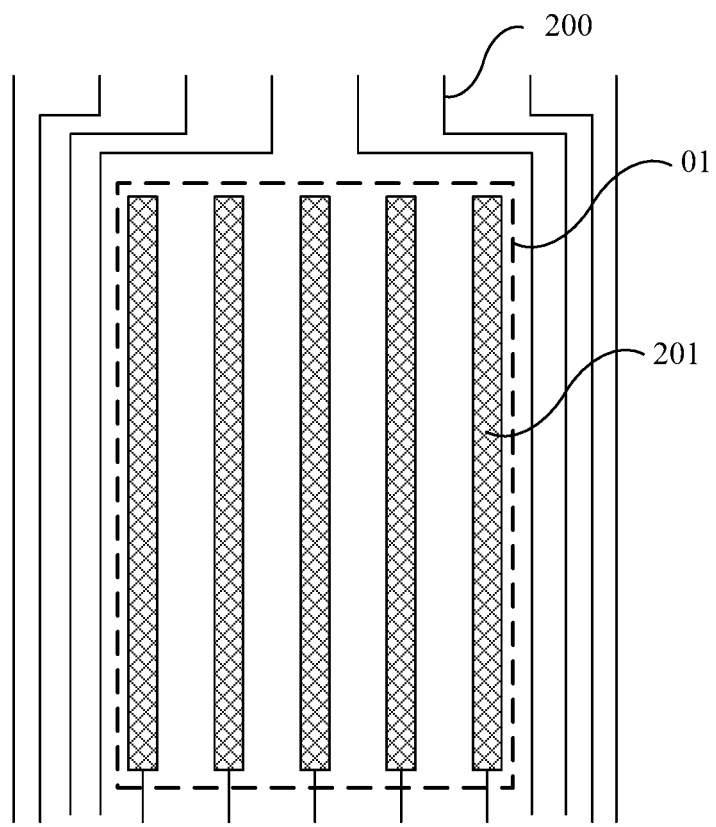
FIG. 3c is a structural schematic diagram of a fingerprint recognition region in an array substrate according to another embodiment of the present disclosure.

In this situation, for the setting of the data line 200, as shown in FIG. 3b, the data line 200 has a shape of straight line and passes through the fingerprint recognition region 01; as shown in FIG. 3c, the data line 200 is curved at the fingerprint recognition region 01, thus the fingerprint recognition region 01 is bypassed; the present disclosure is not limited to this arrangement, and can be designed according to actual needs.

Figure 5:
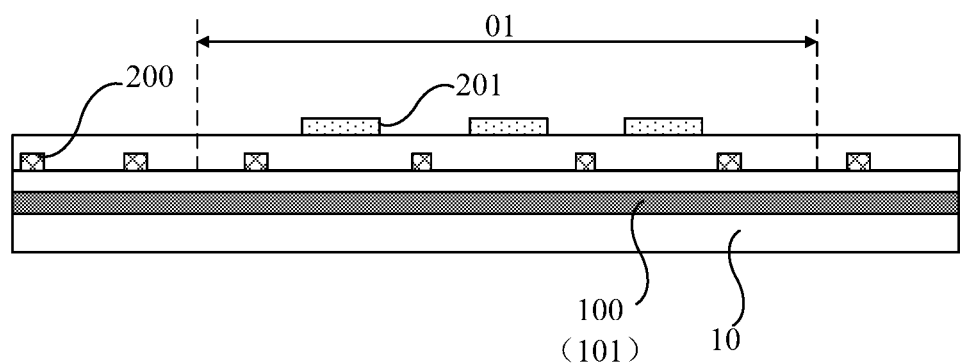
FIG. 5 is a schematic cross-sectional view of an array substrate including a fingerprint recognition region according to another embodiment of the present disclosure.

For another example, as shown in FIG. 2, FIG. 4 and FIG. 5, the sensing electrode 201 may also be located at a different layer from the data line 200, that is, the sensing electrode 201 and the data line 200 are fabricated by two manufacturing processes. In this case, the data line 200 may bypass the fingerprint recognition region 01 or may pass through the fingerprint recognition region 01. The difference is that, in this case, since the sensing electrode 201 and the data line 200 are located in different layers, and generally an insulating layer is disposed between them, as shown in FIG. 2 and FIG. 4, there may be an overlapping region for the sensing electrode 201 and the data the line 200, i.e., the orthographic projections of the sensing electrode 201 and the data the line 200 on the substrate may have an overlapping portion.

It should be noted here that in the case where the data line 200 passes through the fingerprint recognition region 01 (referring to FIG. 3b or FIG. 2), the data signal loaded on the data line 200 may interfere with the sensing signal on the sensing electrode 201. Therefore, in practice, it is necessary to turn off (or pull down) the electrical signal on the data line 200 during the fingerprint recognition phase to ensure that the fingerprint recognition component can normally acquire the fingerprint pattern.

Based on this, the following embodiment is further described. In this embodiment, the transmitting electrode 101 and the gate line 100 are located in different layers, and the sensing electrode 201 and the data line 200 are located in different layers.

Those skilled in the art can understand that the array substrate may have other film layers in addition to the gate lines 100 and the data lines 200. For example, two driving electrodes (e.g., a pixel electrode and a common electrode) are provided in each sub-pixel for driving the sub-pixel. Therefore, in order to simplify the manufacturing process and reduce the manufacturing cost, the transmitting electrode 101, the sensing electrode 201, and other conductive film layers in the array substrate can be fabricated by the same manufacturing process. Two alternative arrangements are provided below, but the present disclosure is not limited thereto.

In some embodiments, as shown in FIG. 4, the array substrate includes a first driving electrode D1 connected to the data line 200, and a second driving electrode D2 located opposite to the first driving electrode D1; the first driving electrode D1 is located between the basal substrate 10 and the second driving electrode D2; the transmitting electrode 101 and the first driving electrode D1 are located in a same layer, and a material of the transmitting electrode 101 is same to a material of the first driving electrode D1 (i.e., the transmitting electrode 101 and the first driving electrode D1 are fabricated by the same manufacturing process); and/or the sensing electrode 201 and the second driving electrode D2 are located in a same layer, and a material of the sensing electrode 201 is same to a material of the second driving electrode D2 (i.e., the sensing electrode 201 and the second driving electrode D2 are fabricated by the same manufacturing process). In this embodiment, the transmitting electrode 101 and the first driving electrode D1 are located in the same layer, and the material of the transmitting electrode 101 is same to the material of the first driving electrode D1. Therefore, in the schematic diagram of FIG. 4, the first driving electrode D1 is blocked by the transmitting electrode 101.

For an array substrate of an LCD, the driving electrode is a pixel electrode; for an array substrate of an OLED display device, the driving electrode is an anode or a cathode connected to the data line. For an array substrate of an LCD, the array substrate may be TN (twist nematic) type, ADS (advanced-super dimensional switching) type, IPS (in plane switch) type, and the like.

Similarly, in some embodiments, the array substrate includes a first driving electrode connected to the data line, and a second driving electrode located opposite to the first driving electrode; the second driving electrode is located between the basal substrate and the first driving electrode; the transmitting electrode and the second driving electrode are located in a same layer, and a material of the transmitting electrode is same to a material of the second driving electrode (i.e., the transmitting electrode and the second driving electrode are fabricated by the same manufacturing process); and/or the sensing electrode and the first driving electrode are located in a same layer, and a material of the sensing electrode is same to a material of the first driving electrode (i.e., the sensing electrode and the first driving electrode are fabricated by the same manufacturing process).

In some embodiments, the array substrate includes a first driving electrode connected to the data line 200 and a second driving electrode disposed opposite the first driving electrode. For an array substrate of an LCD, the array substrate may be of the ADS type, the IPS type (i.e., the first driving electrode and the second driving electrode are arranged in different layers with an interval), or the like. The first driving electrode is a pixel electrode, and the second driving electrode is a common electrode. For an array substrate of an OLED display device, the first driving electrode is an anode (or cathode) connected to the data line, and the second driving electrode is a cathode (or anode).

For example, as shown in FIG. 4, in the case where the transmitting electrode 101 and the first driving electrode D1 are located in the same layer, and the material of the transmitting electrode 101 is same to the material of the first driving electrode D1, it should be understood that one or more insulating layers may be disposed between the gate line 100 and the first driving electrode D1 (depending on the actual type of the array substrate). Therefore, it is necessary to connect the transmitting electrode 101 to the gate line 100 through a via hole on the insulating layer. In some embodiments, as shown in FIG. 4, each of the transmitting electrodes 101 is connected to a corresponding gate line 100 through a plurality of via holes 102. Optionally, as shown in FIG. 4, a plurality of via holes 102 are disposed along the extending direction of the gate line 100, so that the transmitting electrode 101 and the gate line 100 are connected at a plurality of points through the via holes 102, thereby reducing the contact resistance between the transmitting electrode 101 and the gate lines 100.

In summary, according to the solutions of the present disclosure, the transmitting electrode 101 and the sensing electrode 201 can be arranged, for example, in the following ways. As shown in FIG. 4, the transmitting electrode 101 and the gate line 100 are two portions located in different layers and electrically connected, and the sensing electrode 201 and the data line 200 are two portions located in different layers. As shown in FIG. 6 (illustrated by taking the data line 200 passing through the fingerprint recognition region 01 as an example), the transmitting electrode 101 and the gate line 100 are in an integrated structure in the same layer, the sensing electrode 201 is in the same layer as the data line 200, and the material of the sensing electrode 201 is same to the material of the data line 200 (i.e., the sensing electrode 201 and the data line 200 are fabricated by the same manufacturing process). As shown in FIG. 5, the sensing electrode 201 and the data line 200 are two portions located in different layers (i.e., fabricated by two manufacturing processes respectively); the transmitting electrode 101 and the gate line 100 are in an integrated structure in the same layer, and the material of the transmitting electrode 101 is same to the material of the gate line 100. Of course, the sensing electrode 201 and the data line 200 may be made of the same material and arranged in the same layer (i.e., the sensing electrode 201 and the data line 200 are fabricated by the same manufacturing process), and the transmitting electrode 101 and the gate line 100 are two portions which are located in different layers and are electrically connected. The present disclosure is not limited to this, which can be designed according to the needs of the actual fingerprint recognition component and the type of the array substrate.

Figure 7:
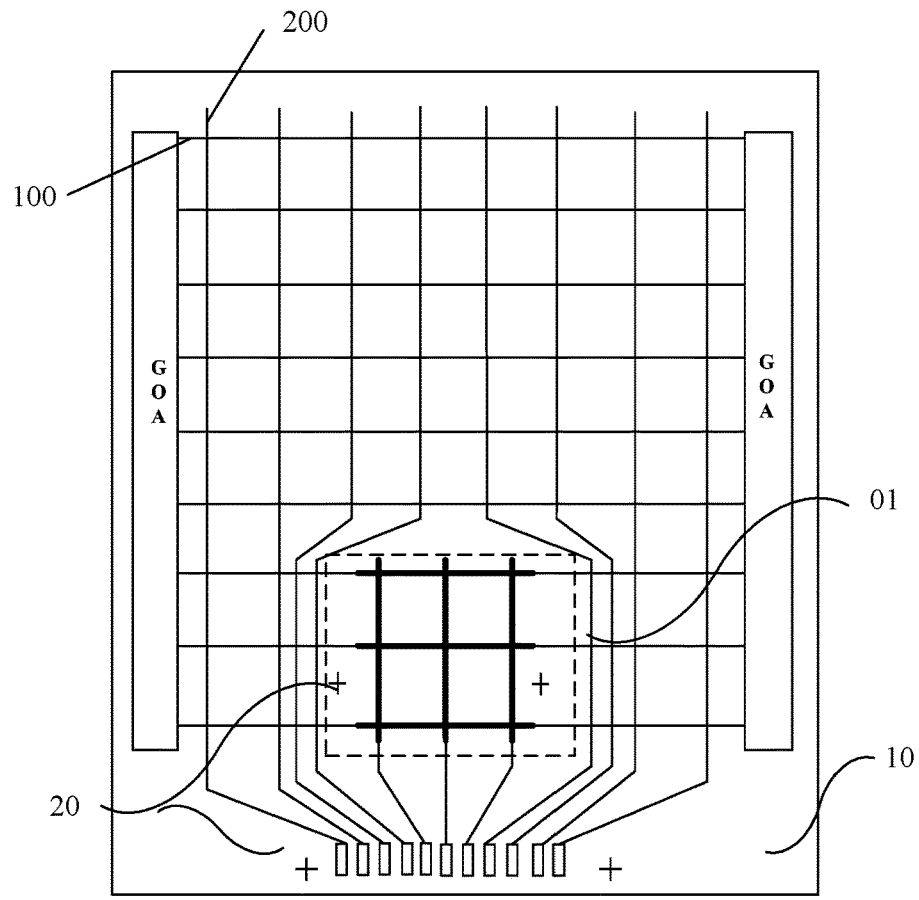
FIG. 7 is a structural schematic diagram of an array substrate including a fingerprint recognition region according to an embodiment of the present disclosure.

On this basis, in order to ensure that other elements (for example, the package cover) of the fingerprint recognition component can be accurately mounted into the fingerprint recognition region 01, optionally, as shown in FIG. 7, the fingerprint recognition region 01 is provided with an alignment mark 20. Of course, in order to ensure that the gate driving circuit or the source driving circuit can be accurately combined in the bonding region, as shown in FIG. 7, the alignment mark 20 is disposed in the bonding region. For example, the alignment mark 20 may be disposed in the vicinity of the bonding bump of the fan-out region. The traces in the trace region can generally be made of titanium-aluminum-titanium (Ti—Al—Ti) material, and a single layer wiring mode can be applied.

In some embodiments, as shown in FIG. 4, the plurality of sensing electrodes 201 are located on a side of the plurality of transmitting electrodes 101 facing away from the basal substrate 10. Since the plurality of sensing electrodes 201 are located on a side of the plurality of transmitting electrodes 101 facing away from the basal substrate 101, when the user's finger is placed on the top side of the embodiment shown in FIG. 4, the sensing electrodes 201 can sense the fingerprint pattern well.

Similarly, in order to realize fingerprint recognition on the bottom side of the embodiment shown in FIG. 4, the plurality of sensing electrodes 201 may also be located on a side of the plurality of transmitting electrodes 101 facing the basal substrate 101 (i.e., the plurality of sensing electrodes 201 are located between the plurality of transmitting electrodes 101 and the basal substrate 101). With such an arrangement, a portion of the displayed image corresponding to the fingerprint recognition region is not occluded during fingerprint recognition. Such an arrangement can be applied, for example, in a transparent display device or a translucent display device, further improving the user's experience.

Further, in order to reduce the noise and the external electric field interfering with the signals on the transmitting electrode and the sensing electrode in the fingerprint recognition region 01, as shown in FIG. 4, optionally, the array substrate further includes a shielding electrode 300 located on a side of the transmitting electrode 101 close to the basal substrate 10. That is, at least in the fingerprint recognition region 01, the shielding electrode is disposed on the side of the transmitting electrode 101 close to the basal substrate 10. The shielding electrode 300 may be made of a metal material, and one end of the shielding electrode 300 may be grounded.

In addition, in order to meet the market demand for a narrow frame of the display product, as shown in FIG. 7, the array substrate in the present disclosure further includes a GOA (gate driver on array) circuit connected to the plurality of gate lines. That is, the gate driving circuit is a GOA circuit. The GOA circuit can realize input of a scanning signal to the gate line, and can also input a transmitting signal to the transmitting electrode. FIG. 7 is an example in which the GOA circuit is disposed on both ends of the gate lines 100. The present disclosure is not limited to this arrangement, and a single-side GOA circuit for the gate lines 100 may also be employed.

Figure 8:
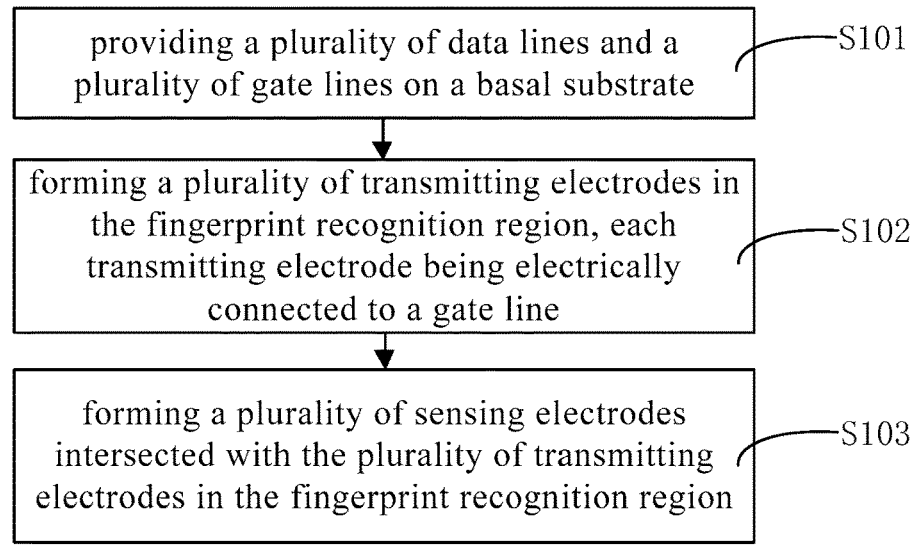
FIG. 8 is a flowchart of a method for manufacturing an array substrate according to an embodiment of the present disclosure.

An embodiment the present disclosure provides a method for manufacturing an array substrate including a fingerprint recognition region. As shown in FIG. 8, the method includes the following steps.

Step S101: providing a plurality of data lines and a plurality of gate lines on a basal substrate.

Step S102: forming a plurality of transmitting electrodes in the fingerprint recognition region, each transmitting electrode being electrically connected to a gate line.

Step S103: forming a plurality of sensing electrodes intersected with the plurality of transmitting electrodes in the fingerprint recognition region.

In the embodiment of the present disclosure, the transmitting electrodes and the sensing electrodes in the fingerprint recognition component are both disposed on the array substrate, and the transmitting electrodes are connected to the gate lines. When the array substrate is applied to a display device, the gate driving circuit in the display device can input not only a scanning signal to the gate line but also a transmitting signal to the transmitting electrode through the gate line. Therefore, the integration degree of the display device including the fingerprint recognition component is improved, the procurement of parts is reduced, and the assembly process is simplified.

The above step S102 will be further described below.

For example, referring to FIG. 3a, the plurality of gate lines 100 include a set of gate lines crossing the fingerprint recognition region 01. The step S102 may specifically include: for each gate line 100 crossing the fingerprint recognition region, forming a portion of the gate line 100 located in the fingerprint recognition region 01 with a width greater than a width of a portion of the gate line 100 located outside the fingerprint recognition region 01.

For another example, referring to FIG. 4, the plurality of gate lines 100 include a set of gate lines crossing the fingerprint recognition region 01. The step S102 may also include: forming a dielectric layer covering the plurality of gate lines (as indicated by 12 and 13 in FIG. 4); for each gate line 100 crossing the fingerprint recognition region, a via hole 102 is formed in the dielectric layer, and an orthographic projection of the gate line 100 on the basal substrate 10 covers an orthographic projection of the via hole 102 on the basal substrate 10; forming a plurality of transmitting electrodes 101 on the dielectric layer, each transmitting electrode 101 being electrically connected to the gate line 100 through the via hole 102.

It should be noted that the wording of "forming . . . on the basal substrate" in the embodiment does not necessarily mean forming a certain component directly on the basal substrate. The basal substrate may have other components or layers depending on the actual manufacturing process of the array substrate and the solution in the present disclosure. In addition, the foregoing method embodiment is a manufacturing method for the array substrate of the foregoing embodiment, and other related specific information of the method embodiment may refer to the array substrate of the foregoing embodiment, which are not described in detail again.

Illustratively, in connection with the embodiment of the array substrate shown in FIG. 4, a specific method of manufacturing an array substrate is provided below.

First, a shielding electrode 300 is formed on the fingerprint recognition region 01 on the basal substrate 10, and the shielding electrode 300 may mainly be made of a material of molybdenum (Mo).

Then, a buffer layer, an active layer, a gate insulating (GI) layer 11, a gate layer (including a gate, a gate line 100, and the like) are formed on the basal substrate on which the shielding electrode 300 is formed. The buffer layer and the active layer are not shown in FIG. 4.

The gate insulating layer 11 is mainly composed of silicon nitride, silicon oxide, silicon oxynitride or the like; the gate layer is mainly composed of a molybdenum (Mo) material; the active layer may be a thin film layer mainly composed of a p-Si material, which can be formed by the LTPS (low temperature p-Si) technology.

Next, an interlayer dielectric (ILD) layer 12 is formed on the basal substrate on which the gate layer (including the gate electrode, the gate line 100, and the like) is formed. The interlayer dielectric layer 12 is mainly made of silicon nitride, silicon oxide, silicon oxynitride or the like.

Then, a data line layer (including the data line 200, the source and the drain, etc.) is formed on the basal substrate on which the interlayer dielectric layer 12 is formed. The data line layer is mainly made of a titanium-aluminum-titanium (Ti—Al—Ti) material.

Next, a planarization (PLN) layer 13 is formed on the basal substrate on which the data line layer (including the data line 200, the source, the drain, and the like) is formed, and a plurality of via holes 102 in the extending direction of the gate line 100. The planarization layer 13 is mainly composed of an organic resin.

Then, a first transparent conductive layer is formed on the basal substrate on which the planarization layer 13 is formed. The first transparent conductive layer may be made of indium tin oxide (ITO). A first driving electrode (for example, a common electrode C-ITO, which is not shown in the drawing) and a transmitting electrode 101 are formed by a patterning process, and the transmitting electrode 101 can be electrically connected to the gate line 100 through the via holes 102.

Next, a protective (PVX) layer 14 is formed on the basal substrate on which the first driving electrode and the transmitting electrode 101 are formed. The protective layer 14 is mainly composed of a material such as silicon nitride, silicon oxide, silicon oxynitride or the like.

Then, a second transparent conductive layer is formed on the basal substrate on which the protective layer 14 is formed. The second transparent conductive layer may be made of indium tin oxide (ITO). A second driving electrode (e.g., the pixel electrode P-ITO, which is not shown in the drawing) and a sensing electrode 201 can be formed by a patterning process.

Of course, the method for manufacturing the array substrate may also include other manufacturing steps, which are not described in detail.

It should be noted that, in the present disclosure, the patterning process may include a photolithography process, or include a photolithography process and an etching step, and may also include other processes for forming a predetermined pattern, such as printing, inkjet, etc.; the photolithography process refers to a process for forming a pattern by using a photoresist, a mask, an exposure machine, or the like, which may include film formation, exposure, development, and the like. The patterning process can be selected in accordance with the structure formed in the present disclosure.

An embodiment the present disclosure further provides a display panel including the array substrate according to any one of the above-mentioned embodiments. The display panel has the same structure and advantageous effects as the array substrate provided by the foregoing embodiments. Since the structure and advantageous effects of the array substrate have been described in detail by the foregoing embodiments, details are not described herein again.

An embodiment of the present disclosure further provides a display device. The display device includes: the above-mentioned display panel, a gate driving circuit connected to the gate lines in the array substrate of the display panel, a source driving circuit connected to the data lines in the array substrate, and a fingerprint recognition module connected to the sensing electrodes in the array substrate. The display device includes the aforementioned array substrate, and has the same structure and advantageous effects as the array substrate provided in the foregoing embodiments. Since the structure and advantageous effects of the array substrate have been described in detail by the foregoing embodiments, details are not described herein again.

It should be noted that, firstly, in the embodiment of the present disclosure, the display device may be a liquid crystal display device or an organic light emitting diode display device. For example, the display device may be any product or component having a display function such as a liquid crystal display, a liquid crystal television, a digital photo frame, a mobile phone, or a tablet computer.

Secondly, the gate driving circuit may be a gate driving IC or a GOA circuit. Alternatively, the present disclosure may apply a GOA circuit; the source driving circuit may be a source driving IC.

In addition, for the fingerprint recognition module connected to the sensing electrodes, the fingerprint recognition module may be a separately provided fingerprint recognition IC, or the fingerprint recognition module may be integrated into the source driving IC. The specific type of the fingerprint recognition module is not limited in the present disclosure, as long as the fingerprint recognition module can read the sensing signal on the sensing electrodes, thereby acquiring the fingerprint pattern. Of course, in order to improve the integration degree of the display device, optionally, the fingerprint recognition module may be integrated into the source driving IC.

Figure 9A:
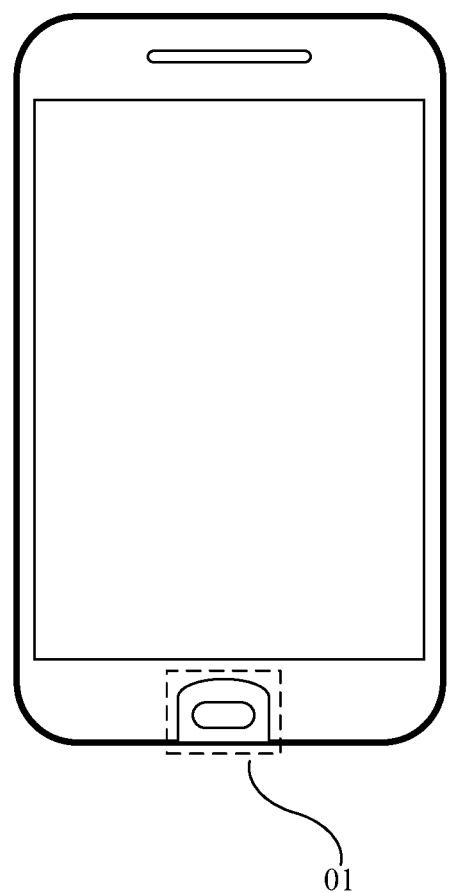
FIG. 9a is a structural schematic diagram of a mobile phone including a fingerprint recognition region according to an embodiment of the present disclosure.
Figure 9B:
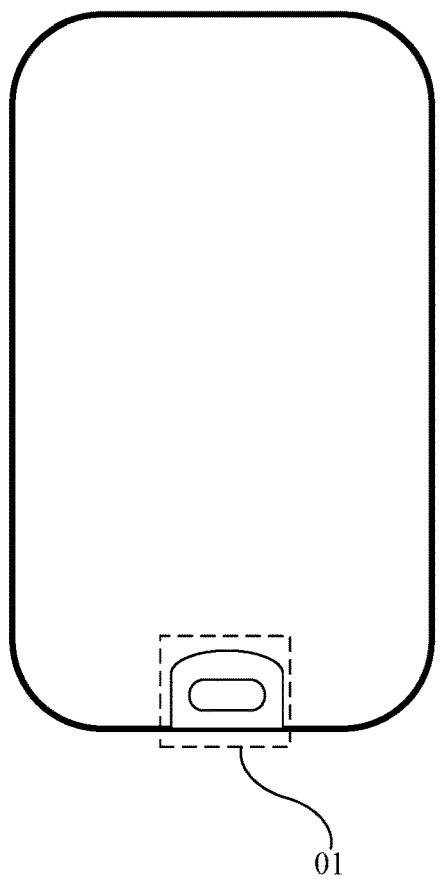
FIG. 9b is a structural schematic diagram of a mobile phone including a fingerprint recognition region according to another embodiment of the present disclosure.

It should also be noted that, according to the solution of the present disclosure, the present disclosure can be applied to COG products, such as a mobile phone having a fingerprint recognition function, which may be a COG-type product with a conventional screen occupation ratio as shown in FIG. 9a. A dummy gate line can be provided in the fingerprint recognition region 01 to directly input a transmitting signal to the transmitting electrode through a gate driving circuit (e.g., GOA). Of course, the present disclosure can also be applied to COF products, such as COF products with ultra-high screen occupation ratio and HIC products (e.g., a mobile phone with an ultra-high screen occupation ratio and fingerprint recognition function as shown in FIG. 9b). The additional value of the display products with fingerprint recognition function can be further improved by adopting the design of the present disclosure.

In addition, with the design of the present disclosure, the high PPI (pixels per inch) characteristic of the current display products can ensure the recognition resolution of the fingerprint recognition component. For example, in general, the arrangement density of the transmitting electrodes and the sensing electrodes can be selected to be a high resolution of 256×300.

Hereinafter, the fingerprint recognition process of the mobile phone will be further described by taking the mobile phone shown in FIG. 9b as an example.

Figure 10:
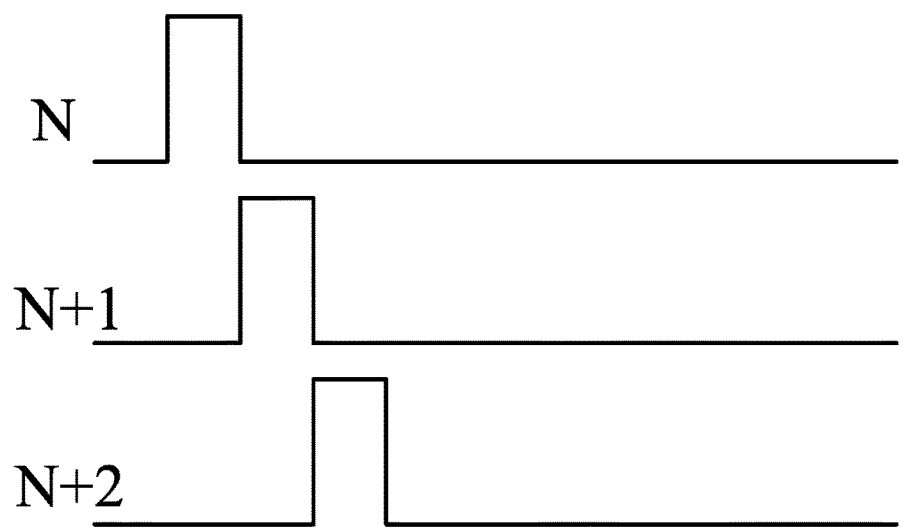
FIG. 10 is a sequence diagram of an input signal for a gate line according to an embodiment of the present disclosure.

The shift register function of GOA is applied (as shown in FIG. 10), the gate lines are thus scanned in the sequence of the Nth row, the N+1th row, and the N+2th row, where N is a positive integer. Specifically, the input frequency may be 60 Hz, and the input signal (voltage) is 5 V, but is not limited thereto. While a signal is input to the gate line 100 of the fingerprint recognition region 01, a transmitting signal is input to the transmitting electrode 101. In this situation, when the sensing electrodes 201 located in the fingerprint recognition region 01 are pressed by the finger, the valley and the ridge in the fingerprint have different distances to the sensing electrodes (or, the capacitors formed by the sensing electrodes and the transmitting electrodes located opposite to the sensing electrodes), resulting in different sensing capacitances. Then, the source driving IC connected to the sensing electrodes reads the sensing capacitance signals on the sensing electrodes, and converts the different sensing capacitance signals into two-dimensional image data, thereby acquiring a gray scale image of the user's fingerprint information.

In the array substrate, the method for manufacturing the same, the display panel, and the display device provided by the embodiments of the present disclosure, the transmitting electrodes and the sensing electrodes in the fingerprint recognition component are both disposed on the array substrate, and the transmitting electrodes are connected to the gate lines. When the array substrate is applied to a display device, the gate driving circuit in the display device can input not only a scanning signal to the gate line but also a transmitting signal to the transmitting electrode through the gate line. Therefore, the integration degree of the display device including the fingerprint recognition component is improved, the procurement of parts is reduced, and the assembly process is simplified.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

What is claimed is:

1. An array substrate, comprising:
   a plurality of data lines;
   a plurality of gate lines; and
   a fingerprint recognition region on a basal substrate,
   wherein the fingerprint recognition region comprises a plurality of transmitting electrodes and a plurality of sensing electrodes intersecting with ones of the plurality of transmitting electrodes,
   wherein each of the plurality of transmitting electrodes are electrically connected to a corresponding one of the plurality of gate lines,
   wherein the array substrate is applied to a display device, and
   wherein each transmitting electrode of the plurality of transmitting electrodes is connected to a corresponding gate line of the plurality of gate lines through a plurality of via holes, and a gate driving circuit in the display device inputs a scanning signal to the gate lines and inputs a transmitting signal to the transmitting electrodes through the gate lines, the plurality of data lines pass through the fingerprint recognition region, and an electrical signal on the plurality of data lines is turned off or pulled down during a fingerprint recognition phase.

2. The array substrate according to claim 1,
   wherein an extending direction of the plurality of transmitting electrodes is a same direction as an extending direction of the plurality of gate lines, and
   wherein an extending direction of the plurality of sensing electrodes is perpendicular to the extending direction of the plurality of transmitting electrodes.

3. The array substrate according to claim 1, wherein the transmitting electrode and the gate line are in different layers.

4. The array substrate according to claim 3, wherein the array substrate further comprises:
a first driving electrode connected to the data line; and
a second driving electrode opposite to the first driving electrode,
wherein the first driving electrode is between the basal substrate and the second driving electrode,
wherein the transmitting electrode and the first driving electrode are in a same layer, and
wherein a material of the transmitting electrode is same as a material of the first driving electrode.

5. The array substrate according to claim 3, wherein the array substrate further comprises:
a first driving electrode connected to the data line; and
a second driving electrode opposite to the first driving electrode,
wherein the second driving electrode is between the basal substrate and the first driving electrode,
wherein the transmitting electrode and the second driving electrode are in a same layer, and
wherein a material of the transmitting electrode is same as a material of the second driving electrode.

6. The array substrate according to claim 3, wherein the array substrate comprises:
a first driving electrode connected to the data line; and
a second driving electrode located opposite to the first driving electrode,
wherein the first driving electrode is located between the basal substrate and the second driving electrode,
wherein the sensing electrode and the second driving electrode are in a same layer, and
wherein a material of the sensing electrode is same as a material of the second driving electrode.

7. The array substrate according to claim 3, wherein the array substrate comprises:
a first driving electrode connected to the data line; and
a second driving electrode located opposite to the first driving electrode,
wherein the first driving electrode is located between the basal substrate and the second driving electrode,
wherein the sensing electrode and the first driving electrode are in a same layer, and wherein a material of the sensing electrode is same as a material of the first driving electrode.

8. The array substrate according to claim 1, wherein the fingerprint recognition region is provided with an alignment mark.

9. The array substrate according to claim 1,
wherein the plurality of sensing electrodes are on a side of the plurality of transmitting electrodes facing away from the basal substrate.

10. The array substrate according to claim 9, further comprising:
a shielding electrode on a side of the transmitting electrode close to the basal substrate.

11. The array substrate according to claim 1, further comprising:
a GOA circuit connected to the plurality of gate lines.

12. A display panel comprising the array substrate according to claim 1.

13. The display device comprising the display panel according to claim 12; and
a fingerprint recognition module connected to the plurality of sensing electrodes.

14. The display device according to claim 13,
wherein the display panel further comprises a source driving circuit, and
wherein the fingerprint recognition module is integrated in the source driving circuit.

15. The array substrate according to claim 1, wherein the sensing electrode and the data line are in different layers.

16. A method for manufacturing an array substrate comprising a fingerprint recognition region, the method comprising:
providing a plurality of data lines and a plurality of gate lines on a basal substrate;
forming a plurality of transmitting electrodes in the fingerprint recognition region, wherein each transmitting electrode of the plurality of transmitting electrodes is electrically connected to a gate line of the plurality of gate lines; and
forming a plurality of sensing electrodes intersecting with the plurality of transmitting electrodes in the fingerprint recognition region,
wherein the array substrate is applied to a display device,
wherein a gate driving circuit in the display device inputs a scanning signal to the gate lines and inputs a transmitting signal to the transmitting electrodes through the gate lines, and
wherein the plurality of gate lines comprise a set of gate lines spanning the fingerprint recognition region, wherein the forming a plurality of transmitting electrodes in the fingerprint recognition region comprises:
forming a dielectric layer on the plurality of gate lines;
forming a via hole in the dielectric layer for each gate line of the plurality of gate lines spanning the fingerprint recognition region, wherein an orthographic projection of the gate line on the basal substrate covers an orthographic projection of the via hole on the basal substrate; and
forming a plurality of transmitting electrodes on the dielectric layer wherein each transmitting electrode of the plurality of transmitting electrodes is electrically connected to a corresponding gate line of the plurality of gates lines through the via hole.

* * * * *